(12) United States Patent
Kasahara

(10) Patent No.: US 8,203,391 B2
(45) Date of Patent: Jun. 19, 2012

(54) OSCILLATING DEVICE

(75) Inventor: Kenji Kasahara, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/591,188

(22) Filed: Nov. 12, 2009

(65) Prior Publication Data

US 2010/0127784 A1 May 27, 2010

(30) Foreign Application Priority Data

Nov. 21, 2008 (JP) .............................. P. 2008-297508

(51) Int. Cl.
*H03B 1/00* (2006.01)

(52) U.S. Cl. ..... 331/69; 331/68; 331/108 C; 331/116 R; 331/158

(58) Field of Classification Search .............. 331/68, 331/69, 108 C, 116 R, 158, 175, 176
See application file for complete search history.

(56) References Cited

U.S. PATENT DOCUMENTS

| | | | | |
|---|---|---|---|---|
| 6,229,404 | B1 * | 5/2001 | Hatanaka | 331/68 |
| 6,501,340 | B1 * | 12/2002 | Flood | 331/69 |
| 7,088,032 | B2 * | 8/2006 | Oita et al. | 310/343 |
| 7,576,476 | B2 * | 8/2009 | Koyama et al. | 310/344 |
| 2006/0214743 | A1 * | 9/2006 | Arai et al. | 331/176 |
| 2007/0268078 | A1 * | 11/2007 | Lee | 331/68 |
| 2008/0129395 | A1 * | 6/2008 | Horie et al. | 331/68 |

FOREIGN PATENT DOCUMENTS

| | | |
|---|---|---|
| JP | 2000-013141 | 1/2000 |
| JP | 2007-157785 | 6/2007 |
| JP | 2007-201616 | 8/2007 |
| JP | 2008-235451 | 10/2008 |

OTHER PUBLICATIONS

Office Action mailed Dec. 21, 2010 from Japan Patent Office in corresponding JP application No. 2008-297508 (English translation attached).

* cited by examiner

*Primary Examiner* — Joseph Chang
*Assistant Examiner* — Jeffrey Shin
(74) *Attorney, Agent, or Firm* — Jacobson Holman PLLC

(57) ABSTRACT

A low-price, compact oscillating device having a good temperature characteristic of a frequency intermediate between a temperature compensated crystal oscillator (TCXO) and an oven-controlled crystal oscillator (OCXO) is provided. The oscillating device having a TCXO is provided with a base on which the TCXO is mounted, that is formed into a box shape having a recess, with a plane area substantially equal to that of the TCXO; and a semiconductor chip including a temperature control circuit, a temperature sensor, and a heating element, mounted in the recess. An opening of the recess is provided in a surface opposite a surface in which the temperature compensated crystal oscillator is mounted, and sealed by a cover. A temperature of the TCXO can be kept constant to provide a oscillating device having an excellent temperature characteristic of a frequency compared with the single TCXO.

12 Claims, 3 Drawing Sheets

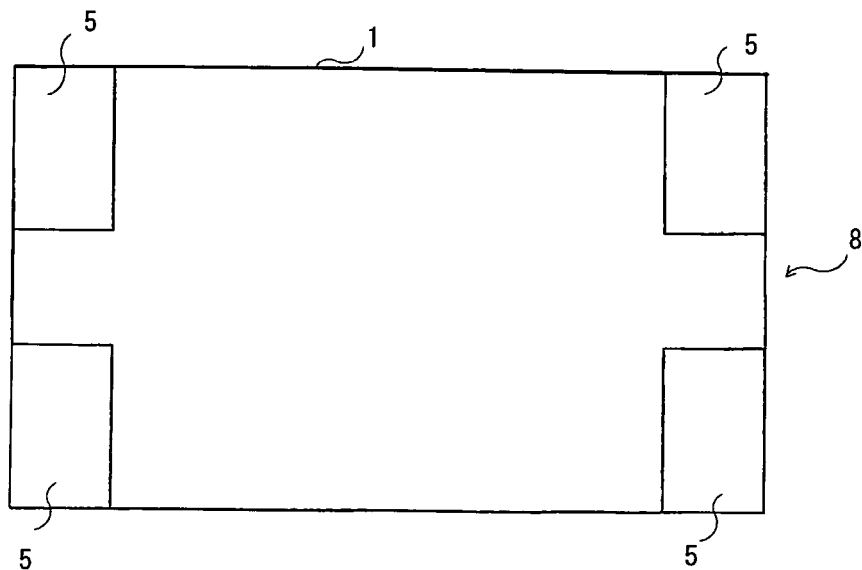
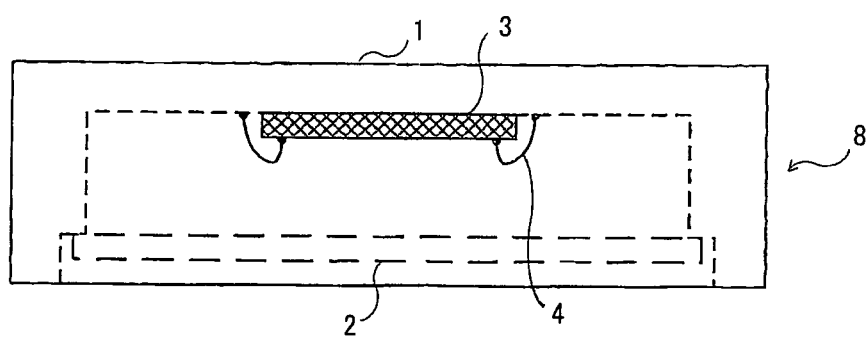
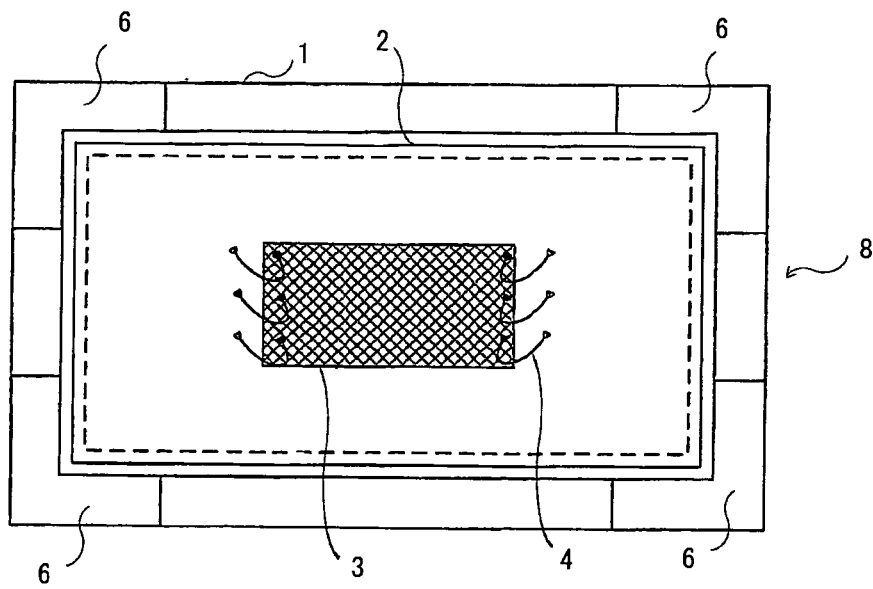

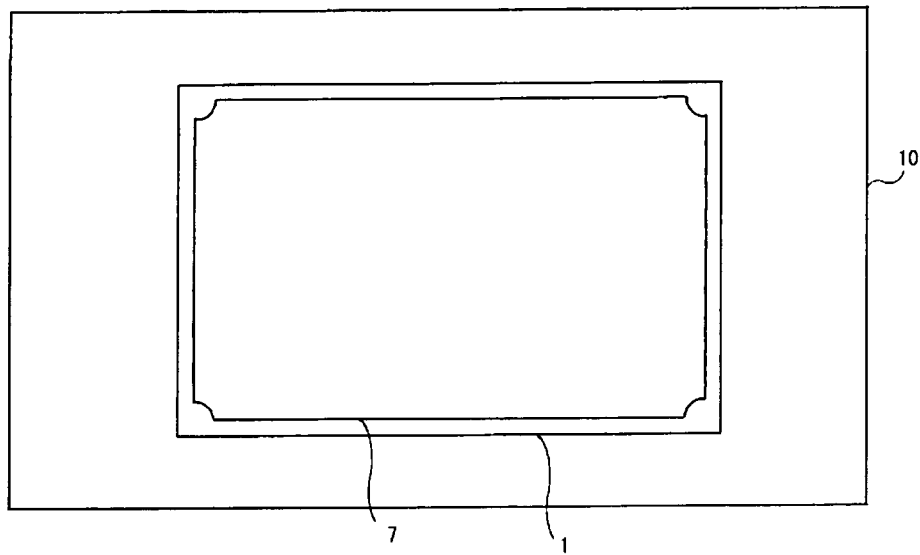
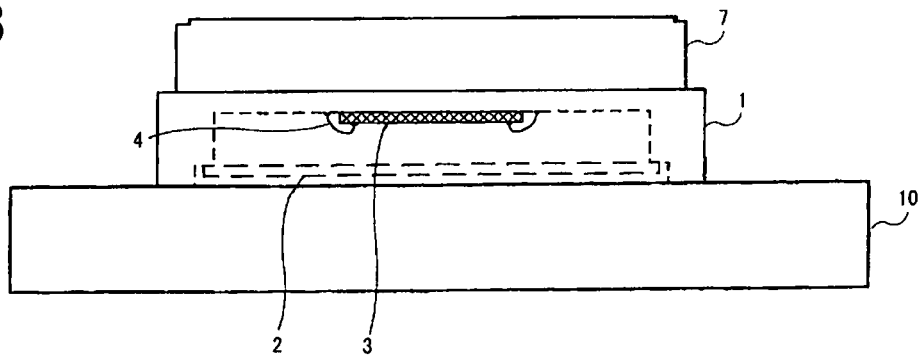

OSCILLATING DEVICE

This application has a priority of Japanese no. 2008-297508 filed Nov. 21, 2008, hereby incorporated by reference.

BACKGROUND OF THE INVENTION

1. Field of the Invention

The present invention relates to an oscillating device, particularly to a compact oscillating device that has an excellent temperature characteristic and can be produced in large quantity at a low price.

2. Description of the Related Art

A temperature compensated crystal oscillator (TCXO) in which a crystal oscillation circuit and a temperature compensation circuit are combined can be cited as an example of an oscillator oscillated at a stable frequency against a temperature change.

Recently a compact communication system such as worldwide interoperability for microwave access (WiMAX) and a femto cell is actively developed.

Frequently, a temperature characteristic better than that of a normal TCXO is required in such applications.

For example, a general TCXO has a temperature characteristic of about ±200 ppb (operating temperature range of −20° C. to +70° C.). On the other hand, the required temperature characteristic ranges from about −50 ppb to about +50 ppb (operating temperature range of −20° C. to +70° C.). Therefore, it is difficult that the required temperature characteristic is realized by the general TCXO.

An oven controlled crystal oscillator (OCXO) including a constant-temperature oven is well known as the oscillating device having the temperature characteristic better than that of the TCXO. However, disadvantageously, the OCXO is more expensive and larger than the TCXO. Therefore, there is the need of a compact, low-price oscillating device having a temperature characteristic intermediate between the TCXO and the OCXO.

[Configuration of Conventional Oscillating Device]

Conventionally, there is an oscillating device in which a temperature of the TCXO is kept constant to improve the temperature characteristic of the frequency compared with the single TCXO.

A configuration of the conventional oscillating device in which the temperature of the TCXO is kept constant will be described with reference to FIG. 3. FIG. 3 is an explanatory view schematically illustrating a configuration of a conventional oscillating device, FIG. 3A is a side view of the conventional oscillating device, and FIG. 3B is a plan view of the conventional oscillating device.

As illustrated in FIG. 3, the conventional oscillating device has the configuration in which a TCXO 12, a power transistor 13, a temperature controlling OP amplifier 14, and a heating resistor 15 are mounted on a glass epoxy board 11.

A board 11 on which the TCXO 12 and various electronic components are mounted is disposed on a base, and a cover is provided on the base to seal the base.

In the conventional oscillating device, the number of components except for the TCXO is increased, and the components are disposed around the TCXO 12. Therefore, it is difficult to reduce a plane area of the whole of oscillating device. Thus, a volume of the oscillating device is much larger than that of the single TCXO (10 times or more), and the oscillating device becomes expensive.

[Document of Related Art]

For example, conventional techniques regarding the structure of the oscillating device are disclosed in Japanese Patent Application Laid-Open Nos. 2005-223395 (applicant: TOYO Communication Equipment Co., Ltd), 2007-201616 (applicant: Epson Toyocom Corporation), and 2007-235482 (applicant: KYOCERA KINSEKI Corporation).

Japanese Patent Application Laid-Open No. 2005-223395 discloses the oscillator having the following structure. In a TCXO, a board on which an integrated circuit is mounted is provided on an integrated circuit, a temperature control circuit and a heating element are incorporated in the integrated circuit, and a sub-board on which an oscillating device and an oscillating circuit are mounted is connected to the board.

Japanese Patent Application Laid-Open No. 2007-201616 discloses the oscillator having the structure, in which IC including a temperature compensation circuit and an oscillating circuit is surrounded by a flexible board and a piezoelectric oscillator package is mounted on the IC.

In the oscillator disclosed in Japanese Patent Application Laid-Open No. 2007-235482, a first space and a second space are formed across a board from each other, a piezoelectric oscillating piece is accommodated in the first space, and IC is accommodated in the second space. A temperature sensor, a temperature compensation circuit, and an oscillating circuit are incorporated in the IC.

In the conventional oscillating device of FIG. 3 in which the temperature of the TCXO is kept constant, although the temperature characteristic of the frequency is improved compared with the single TCXO, unfortunately the TCXO is not efficiently heated, the number of components is increased to hardly achieve the miniaturization, and the oscillating device becomes expensive.

SUMMARY OF THE INVENTION

In view of the foregoing, an object of the invention is to provide a low-price, compact oscillating device having a good temperature characteristic of a frequency intermediate between the TCXO and the OCXO.

In order to cope with the above-stated problems of conventional examples, an oscillating device according to an aspect of the invention having a temperature compensated crystal oscillator, provided with a base on which the temperature compensated crystal oscillator is mounted, that is formed into a box shape having a recess, with a plane area substantially equal to that of the temperature compensated crystal oscillator; and a semiconductor chip including a temperature control circuit, a temperature sensor, and a heating element, mounted in the recess. In the oscillating device an opening of the recess is provided in a surface opposite a surface in which the temperature compensated crystal oscillator is mounted, and sealed by a cover. Therefore, the semiconductor chip controls temperature of the recess space of the base, which is provided while being in close contact with the temperature compensated crystal oscillator, such that the recess space is kept at a constant temperature, so that the temperature compensated crystal oscillator can efficiently be heated to keep the temperature of the temperature compensated crystal oscillator constant while temperature characteristic of the frequency is improved compared with the single temperature compensated crystal oscillator. Further, the size of the base is substantially equal to that of the mounted temperature compensated crystal oscillator, and the electronic components are integrated in the semiconductor chip, so that advantageously miniaturization of the oscillating device can be realized.

In the oscillating device according to the aspect of the invention, in the base, an input and output electrode is provided in the surface in which the opening is provided, while an oscillator mounting electrode is provided in the surface in which the temperature compensated crystal oscillator is mounted, and the temperature compensated crystal oscillator is electrically connected to an outside through the oscillator mounting electrode and the input and output electrode while fixed to the surface in which the oscillator mounting electrode of the base is provided.

In the oscillating device according to the aspect of the invention, the base is made of a ceramic material, so that advantageously the cost can be reduced to realize the low prices in the quantity production.

In the oscillating device according to the aspect of the invention, a metallic cover is attached to the surface in which the temperature compensated crystal oscillator of the base is mounted, the temperature compensated crystal oscillator being covered with the metallic cover, so that advantageously the temperature of the temperature compensated crystal oscillator can further be stabilized to obtain better characteristic.

In the oscillating device according to the aspect of the invention, the recess is filled with molding resin to cover the semiconductor chip instead of sealing the opening of the recess with the cover, so that advantageously the number of components can be decreased to realize the process simplification and the cost reduction.

BRIEF DESCRIPTION OF THE DRAWINGS

FIG. 1A is a schematic diagram as a plan view of a constant-temperature unit used in an oscillating device according to an embodiment of the invention.

FIG. 1B is a schematic diagram as a longitudinal sectional view of the constant-temperature unit.

FIG. 1C is a schematic diagram as a bottom view of the constant-temperature unit.

FIG. 2A is a schematic diagram as a plan view of the oscillating device of the embodiment.

FIG. 2B is a schematic diagram as a longitudinal sectional view of the oscillating device.

Figure 3A:
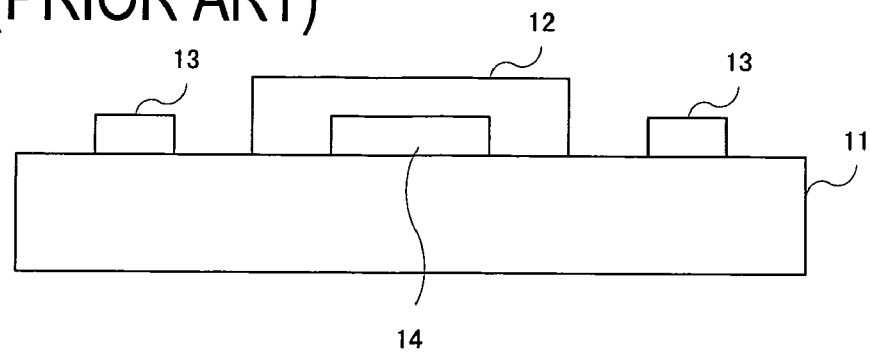
FIG. 3A is a side view of the conventional oscillating device.

DESCRIPTION OF REFERENCE NUMERALS 1 ceramic base
2 cover
3 semiconductor chip
4 bonding wire
5 TCXO mounting pattern
6 input and output terminal pattern
7 TCXO
8 constant-temperature unit
10 board
11 glass epoxy board
12 TCXO
13 power transistor
14 OP amplifier
15 heating resistor

DESCRIPTION OF THE PREFERRED EMBODIMENT

[General Description of the Invention]

An exemplary embodiment of the invention will be described below with reference to the drawings. An oscillating device according to an embodiment of the invention has a configuration, in which a constant-temperature unit is provided in a space of a ceramic base and a TCXO is mounted on an upper surface portion of the constant-temperature unit while being able to be electrically connected with the constant-temperature unit. The ceramic base is formed into a box shape having a plane area substantially equal to that of the TCXO. A semiconductor chip is mounted on the constant-temperature unit. A temperature sensor, a heating element, and a temperature control circuit are incorporated in the semiconductor chip. The space of the ceramic base in which the semiconductor chip is mounted acts as a pseudo oven, and the TCXO is efficiently heated to keep a temperature of the TCXO constant, so that the temperature characteristic of the frequency can be improved compared with the single TCXO. Further, the plane area and the volume can be decreased by integrating plural components, and the normal TCXO is used, so that the compact oscillating device having the excellent temperature characteristic can be implemented at a low price.

[Configuration of Constant-Temperature Unit of Embodiment: FIG. 1]

FIG. 1 is a schematic diagram illustrating a configuration of a constant-temperature unit used in an oscillating device according to an embodiment of the invention, FIG. 1A is a plan view of the constant-temperature unit, FIG. 1B is a longitudinal sectional view of the constant-temperature unit, and FIG. 1C is a bottom view of the constant-temperature unit.

The constant-temperature unit, which is of the feature of the oscillating device, constitutes the base on which the TCXO is mounted. The constant-temperature unit has a size substantially equal to that of the mounted TCXO. As illustrated in FIGS. 1B and 1C, a constant-temperature unit 8 mainly includes a ceramic base 1, a cover 2, and a semiconductor chip 3. The semiconductor chip 3 is connected to a wiring formed in the ceramic base 1 by a bonding wire 4.

The ceramic base 1 is made of a ceramic material, and a rectangular recess is formed in the ceramic base 1. In FIG. 1B, the ceramic base 1 is disposed such that an opening of the recess is located on the downside, and the semiconductor chip 3 is mounted in an upper surface portion of the recess in the ceramic base 1. The ceramic base corresponds to the base of the invention.

The semiconductor chip 3 is an IC chip in which at least the temperature sensor, heating element, and temperature control circuit are incorporated. The semiconductor chip 3 controls a temperature in the ceramic base 1 to a specific temperature.

The temperature sensor measures a surrounding temperature.

The heating element generates heat.

Based on temperature data from the temperature sensor, the temperature control circuit controls a current supplied to the heating element such that the temperature of the space in the ceramic base 1 is kept at a set temperature.

A cover (top) 2 is attached to the opening of the recess of the ceramic base 1, and the cover 2 is fixed to the opening of the ceramic base 1 by a molding material. The recess space of the ceramic base 1 is cut off from the outside by providing the cover 2, which allows radiation to be prevented to decrease the temperature fluctuation.

In the constant-temperature unit 8 of the oscillating device, the semiconductor chip 3 is sealed while accommodated in the recess of the ceramic base 1, and the temperature control circuit on the semiconductor chip 3 is operated so as to keep the temperature in the recess space constant, whereby the recess space acts as the pseudo oven.

Therefore, the constant-temperature unit 8 of the oscillating device heats TCXO mounted in the upper surface portion of the ceramic base 1 to a constant temperature by a simple, compact configuration compared with the general constant-temperature oven of the OCXO.

As illustrated in FIG. 1C, in the constant-temperature unit 8 of the oscillating device, an input and output terminal pattern 6 is formed in a bottom portion of the ceramic base 1. The input and output terminal pattern 6 is an electrode pattern that is used for the electric supply or signal input and output.

In the oscillating device, a TCXO (not shown) is mounted on the upper surface portion of the ceramic base 1.

As illustrated in FIG. 1A, the constant-temperature unit 8 of the oscillating device, a TCXO mounting pattern 5 is formed in the upper surface portion of the ceramic base 1. The TCXO mounting pattern 5 is an electrode pattern used to mount a component (in this case, TCXO) that is of a target whose temperature is kept constant.

In the oscillating device, a TCXO (not shown) is mounted on the upper surface portion of the ceramic base 1.

That is, in the oscillating device of the embodiment, TCXO is mounted in the upper surface portion of the constant-temperature unit 8 of FIG. 1, TCXO is fixed while being able to be electrically connected, and TCXO is integral with the constant-temperature unit 8, so that TCXO can be expressed as a pseudo constant-temperature oven added TCXO.

Figure 3B:
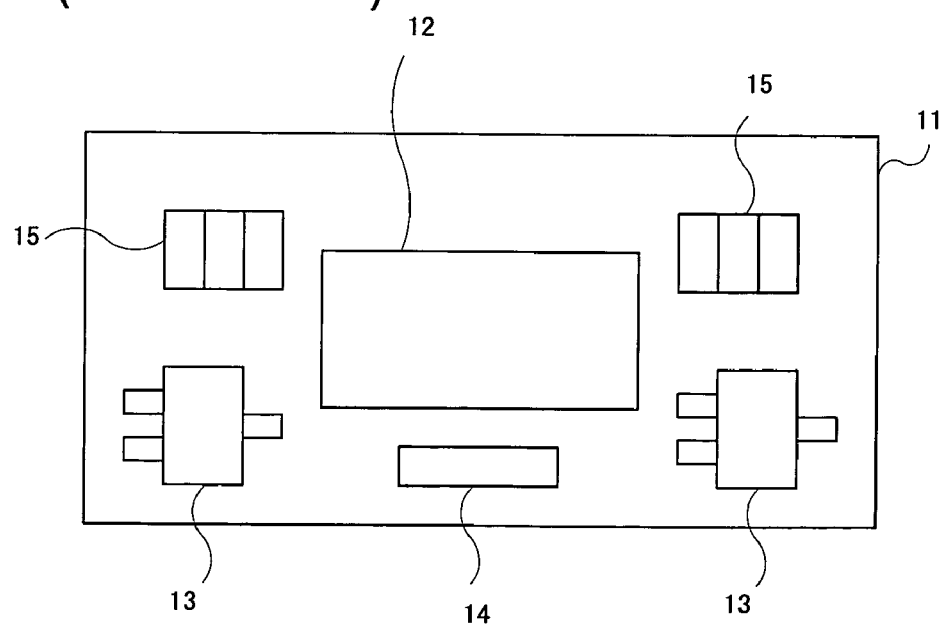
FIG. 3B is a plan view of the conventional oscillating device.

In the conventional oscillating device of FIG. 3, the heating element and the temperature control circuit are mounted as independent electronic components on the board in the surrounding of TCXO. On the other hand, in the constant-temperature unit 8 of the oscillating device, the components are integrated in one chip and provided below TCXO, so that the miniaturization and cost reduction can be achieved in the oscillating device.

Additionally, constant-temperature units corresponding to various TCXOs can be formed by such a simple adjustment that the shape of the ceramic base 1 of the constant-temperature unit 8 or the shape and disposition of the TCXO mounting pattern 5 are changed, and the oscillating device having the excellent temperature characteristic can be produced at a low price using TCXO corresponding to the required characteristic.

[Configuration of Oscillating Device of Embodiment: FIG. 2]

The oscillating device of the embodiment and a configuration of a usage example thereof will be described below with reference to FIG. 2. FIG. 2 is a schematic diagram illustrating a configuration of the oscillating device of the embodiment, FIG. 2A is a plan view of the oscillating device, and FIG. 2B is a longitudinal sectional view of the oscillating device.

As illustrated in FIGS. 2A and 2B, the oscillating device of the embodiment has a configuration in which TCXO 7 is mounted the constant-temperature unit 8.

TCXO 7 is connected to the TCXO mounting pattern 5 on the ceramic base 1 by solder or a conductive bonding agent, and TCXO 7 is fixed to the upper surface portion of the ceramic base 1 of the constant-temperature unit 8.

As illustrated in FIG. 2B, a plane area (plane area of a ceramic base 1) of the constant-temperature unit 8 is substantially equal to a plane area of TCXO 7, the plane area of the constant-temperature unit 8 is considerably smaller than that of the conventional oscillating device of FIG. 3. A volume of the constant-temperature unit 8 is about double that of TCXO 7. Therefore, the oscillating device of the embodiment can sufficiently be miniaturized compared with the conventional oscillating device of FIG. 3.

Further, in the oscillating device of the embodiment, because the constant-temperature unit 8 is provided while being in close contact with TCXO 7, TCXO 7 can efficiently be heated, and the temperature fluctuation of TCXO 7 can be decreased to improve the temperature characteristic of the frequency.

As illustrated in FIGS. 2A and 2B, the oscillating device of the embodiment is used while mounted on a board 10 of a product.

Thus, in the oscillating device of the embodiment, the general TCXO can be mounted in a retro-fit manner on the constant-temperature unit 8, so that the oscillating device in which the excellent temperature characteristic of the frequency is realized with quantity-production TCXO can be produced at a low price.

Advantages of the Embodiment

The oscillating device of the embodiment includes the constant-temperature unit 8. In the constant-temperature unit 8, the recess is formed in the ceramic base 1, the opening is formed in the downside of the ceramic base 1, the semiconductor chip 3 that controls the temperature to a constant value is mounted in the recess, the temperature control circuit, the temperature sensor, and the heating element are incorporated in the semiconductor chip 3, the opening is sealed by the cover 2, and TCXO 7 is mounted in the upper surface portion of the ceramic base 1 of the constant-temperature unit 8. Therefore, advantageously the constant-temperature unit 8 keeps TCXO 7 at a constant temperature, the temperature characteristic of the frequency is improved compared with the single TCXO, and the temperature characteristic of the frequency intermediate between the TCXO and the OCXO can be obtained.

In the oscillating device of the embodiment, the electronic components used in the constant-temperature unit 8 are integrated in the semiconductor chip 3, and the constant-temperature unit 8 and TCXO 7 are laminated while the size of the constant-temperature unit 8 is substantially equalized to that of TCXO 7. Therefore, advantageously the size of the entire oscillating device can largely miniaturized compared with the oscillating device of FIG. 3 or the conventional OCXO.

In the oscillating device of the embodiment, the quantity-production TCXO is mounted in the retro-fit manner on the constant-temperature unit 8, so that advantageously the oscillating device having the excellent temperature characteristic of the frequency can be produced in large quantities at a low price.

Because the constant-temperature unit 8 is formed in the ceramic base, advantageously the low price can be realized in the quantity production.

In the configuration of FIG. 1, instead of sealing the opening of the ceramic base 1 with the cover 2, the molding material may be injected in the whole of the recess to cover the semiconductor chip 3 and bonding wire 4 therewith. Therefore, the number of components can be decreased to achieve the process simplification and reduction of production cost. A metallic cover with which TCXO 7 is covered may be mounted on the constant-temperature unit 8 of the oscillating device. Therefore, the temperature of TCXO can further be stabilized to improve the characteristic.

Particularly, the invention is suitable to the compact, low-price oscillating device having the excellent temperature characteristic.

What is claimed is:

1. An oscillating device having a temperature compensated crystal oscillator, comprising:

a constant-temperature unit including
a base made of a ceramic material that is formed into a box shape having a recess of which an opening is formed in a downside, with a plane area in contact with the temperature compensated crystal oscillator substantially equal to a bottom surface of the temperature compensated crystal oscillator and a size substantially equal to that of the temperature compensated crystal oscillator;
a cover sealing the opening of the recess, and
a semiconductor chip including a temperature control circuit for controlling so as to keep a temperature in the recess space of the base sealed by the cover constant, a temperature sensor, and a heating element, accommodated in the recess,
the temperature compensated crystal oscillator in which a crystal oscillator circuit and a temperature compensation circuit are combined, being operated so as to keep a temperature of the crystal oscillator circuit by the temperature compensation circuit, and being mounted in close contact with an upper surface of the base of the constant-temperature unit which is an opposite side of the opening of the recess.

2. The oscillating device according to claim 1, wherein, in the base, an oscillator mounting electrode is provided in the surface in which the temperature compensated crystal oscillator is mounted, and
the temperature compensated crystal oscillator is fixed to the surface in which the oscillator mounting electrode of the base is provided.

3. The oscillating device according to claim 2, wherein a metallic cover is attached to the surface in which the temperature compensated crystal oscillator of the base is mounted, the temperature compensated crystal oscillator being covered with the metallic cover.

4. The oscillating device according to claim 2, wherein a metallic cover is attached to the surface in which the temperature compensated crystal oscillator of the base is mounted, the temperature compensated crystal oscillator being covered with the metallic cover.

5. The oscillating device according to claim 1, wherein a metallic cover is attached to the surface in which the temperature compensated crystal oscillator of the base is mounted, the temperature compensated crystal oscillator being covered with the metallic cover.

6. The oscillating device according to claim 1, wherein a metallic cover is attached to the surface in which the temperature compensated crystal oscillator of the base is mounted, the temperature compensated crystal oscillator being covered with the metallic cover.

7. An oscillating device having a temperature compensated crystal oscillator, comprising:
a constant-temperature unit including
a base made of a ceramic material that is formed into a box shape having a recess of which an opening is formed in a downside, with a plane area in contact with the temperature compensated crystal oscillator substantially equal to a bottom surface of the temperature compensated crystal oscillator and a size substantially equal to that of the temperature compensated crystal oscillator;
a molding resin to fill in the recess,
a semiconductor chip including a temperature control circuit for controlling so as to keep a temperature in the recess space of the base filled with the molding resin to cover the semiconductor chip constant, a temperature sensor, and a heating element, accommodated in the recess, and
the temperature compensated crystal oscillator in which a crystal oscillator circuit and a temperature compensation circuit are combined, being operated so as to keep a temperature of the crystal oscillator circuit by the temperature compensation circuit, and being mounted in close contact with an upper surface of the base of the constant-temperature unit which is an opposite side of the opening of the recess.

8. The oscillating device according to claim 7, wherein, in the base, an oscillator mounting electrode is provided in the surface in which the temperature compensated crystal oscillator is mounted, and
the temperature compensated crystal oscillator is fixed to the surface in which the oscillator mounting electrode of the base is provided.

9. The oscillating device according to claim 8, wherein a metallic cover is attached to the surface in which the temperature compensated crystal oscillator of the base is mounted, the temperature compensated crystal oscillator being covered with the metallic cover.

10. The oscillating device according to claim 8, wherein a metallic cover is attached to the surface in which the temperature compensated crystal oscillator of the base is mounted, the temperature compensated crystal oscillator being covered with the metallic cover.

11. The oscillating device according to claim 7, wherein a metallic cover is attached to the surface in which the temperature compensated crystal oscillator of the base is mounted, the temperature compensated crystal oscillator being covered with the metallic cover.

12. The oscillating device according to claim 7, wherein a metallic cover is attached to the surface in which the temperature compensated crystal oscillator of the base is mounted, the temperature compensated crystal oscillator being covered with the metallic cover.

* * * * *